United States Patent
Chen et al.

(10) Patent No.: US 7,335,543 B2
(45) Date of Patent: Feb. 26, 2008

(54) MOS DEVICE FOR HIGH VOLTAGE OPERATION AND METHOD OF MANUFACTURE

(75) Inventors: John Chen, Shanghai (CN); Roger Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/928,004

(22) Filed: Aug. 27, 2004

(65) Prior Publication Data

US 2005/0287753 A1 Dec. 29, 2005

(30) Foreign Application Priority Data

Jun. 28, 2004 (CN) .................. 2004 1 0025738

(51) Int. Cl.
H01L 21/336 (2006.01)
(52) U.S. Cl. .................. 438/197; 438/303; 438/306
(58) Field of Classification Search ................ 438/197, 438/301, 303, 306, 307
See application file for complete search history.

(56) References Cited

U.S. PATENT DOCUMENTS

| | | | | |
|---|---|---|---|---|
| 4,764,481 A | * | 8/1988 | Alvi et al. ................ | 438/227 |
| 4,837,181 A | * | 6/1989 | Galbiati et al. ........... | 438/278 |
| 5,970,329 A | * | 10/1999 | Cha ........................ | 438/197 |
| 6,136,657 A | * | 10/2000 | Yang et al. ............... | 438/303 |
| 6,153,543 A | | 11/2000 | Chesire et al. | |
| 6,380,053 B1 | * | 4/2002 | Komatsu .................. | 438/517 |

(Continued)

FOREIGN PATENT DOCUMENTS

KR 2001019125 A1 * 3/2001

*Primary Examiner*—T. N. Quach
(74) *Attorney, Agent, or Firm*—Townsend and Townsend and Crew LLP

(57) ABSTRACT

A high voltage semiconductor device. The high voltage device has a substrate (e.g., silicon wafer) having a surface region. The substrate has a well region within the substrate and a double diffused drain region within the well region. A gate dielectric layer is overlying the surface region. A gate polysilicon layer is overlying the gate dielectric layer. A mask layer is overlying the gate polysilicon layer. The device also has a gate electrode formed within the gate polysilicon layer. The gate electrode has a first predetermined width and a first predetermined thickness. Preferably, the gate electrode has a first side and a second side formed between the first predetermined width. The gate electrode is coupled to the double diffused drain region within the well region. Preferably, the first side has a lower corner overlying the gate dielectric layer and an upper corner underlying the mask layer and the second side has a lower corner overlying the gate dielectric layer and an upper corner underlying the mask layer. A first insulating region formed from polysilicon is formed at the lower corner on the first side of the gate electrode. The first insulating region extends from the first side toward a first preselect region within the gate electrode. A second insulating region formed from polysilicon material is at the lower corner on the second side of the gate electrode. The second insulating region extends from the second side toward a second preselected region within the gate electrode. A second predetermined width is formed between the first preselect region and the second preselected region. The second predetermined width comprises substantially polysilicon material. Preferably, the high voltage device has a breakdown voltage of the high voltage semiconductor device is characterized by a voltage of greater than 20 volts.

9 Claims, 4 Drawing Sheets

U.S. PATENT DOCUMENTS 6,383,881 B1 * 5/2002 Akram et al. ............... 438/303
6,639,319 B2 * 10/2003 Trivedi et al. .............. 257/751
6,905,927 B2 * 6/2005 Ahn et al. .................. 438/257

* cited by examiner

MOS DEVICE FOR HIGH VOLTAGE OPERATION AND METHOD OF MANUFACTURE

CROSS-REFERENCES TO RELATED APPLICATIONS

This application claims priority to Chinese Patent Application No. 200410025738.X, filed on Jun. 28, 2004, and is incorporated herein by reference.

BACKGROUND OF THE INVENTION

The present invention is directed to integrated circuits and their processing for the manufacture of semiconductor devices. More particularly, the invention provides a method for manufacturing a high voltage MOS transistor switching device. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

A high voltage MOS device is an example of an integrated circuit chip that often requires smaller designs but should achieve higher voltage capability. Smaller designs often cause lower voltages, which are undesirable for these types of integrated circuit devices. Higher breakdown voltages are desired but are often at the expense of size, which limits the number of integrated circuits that can be fabricated on a single wafer. High voltage MOS transistors operable at more than 30 volts must often use Lateral Drain MOS device structures, commonly called LDMOS, for higher junction breakdown voltages. Unfortunately, LDMOS structures are often larger in size. Smaller high voltage MOS transistors rely upon Drain Diffusion MOS device structures (DDMOS). Although these DDMOS structures are smaller, they are generally operable at voltages from about 12 volts to 20 volts. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method for manufacturing a high voltage MOS transistor switching device. But it would be recognized that the invention has a much broader range of applicability.

In a specific embodiment, the invention provides a method for fabricating a high voltage semiconductor device. The method includes providing a substrate (e.g., silicon wafer) having a surface region. The method includes forming a well region within the substrate and forming a double diffused drain region within the well region. The method also includes forming a gate dielectric layer overlying the surface region and forming a gate polysilicon layer overlying the gate dielectric layer. A mask layer is formed overlying the gate polysilicon layer. The method includes patterning the gate polysilicon layer to form a gate electrode having a first predetermined width and a predetermined thickness. The gate electrode has a first side and a second side formed between the first predetermined width. The gate electrode is coupled to the double diffused drain region within the well region. Preferably, the first side has a lower corner overlying the gate dielectric layer and an upper corner underlying the mask layer and the second side has a lower corner overlying the gate dielectric layer and an upper corner underlying the mask layer. The method causes an oxidation of the gate electrode such that the lower corner on the first side and the lower corner on the second side convert from polysilicon material into silicon dioxide while the upper corner on the first side and the upper corner on the second side are substantially free from oxidation. The method continues to convert the lower corner of the first side and the lower corner of the second side to reduce the first predetermined with of the gate electrode comprising polysilicon material to a second predetermined width to increase a breakdown voltage of the high voltage semiconductor device to greater than 20 volts.

In an alternative specific embodiment, the invention provides a high voltage semiconductor device. The device has a substrate having a surface region. The substrate has a well region within the substrate and a double diffused drain region within the well region. A gate dielectric layer is overlying the surface region. A gate polysilicon layer is overlying the gate dielectric layer. A mask layer is overlying the gate polysilicon layer. The device also has a gate electrode formed within the gate polysilicon layer. The gate electrode has a first predetermined width and a first predetermined thickness. Preferably, the gate electrode has a first side and a second side formed between the first predetermined width. The gate electrode is coupled to the double diffused drain region within the well region. Preferably, the first side has a lower corner overlying the gate dielectric layer and an upper corner underlying the mask layer and the second side has a lower corner overlying the gate dielectric layer and an upper corner underlying the mask layer. A first insulating region formed from polysilicon is formed at the lower corner on the first side of the gate electrode. The first insulating region extends from the first side toward a first preselect region within the gate electrode. A second insulating region formed from polysilicon material is at the lower corner on the second side of the gate electrode. The second insulating region extends from the second side toward a second preselected region within the gate electrode. A second predetermined width is fromed between the first preselect region and the second preselected region. The second predetermined width comprises substantially polysilicon material. Preferably, the high voltage device has a breakdown voltage of the high voltage semiconductor device is characterized by a voltage of greater than 20 volts.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an efficient way of achieving high voltage applications, e.g., 20 volts and greater. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method for manufacturing a high voltage MOS transistor switching device. But it would be recognized that the invention has a much broader range of applicability.

Before discussing details of the present invention, we have provided a brief description of certain limitations of conventional high voltage MOS devices, which we have uncovered. MOS transistors characterized by more than 30V operation generally use Lateral Drain Device MOS structures (LDMOS) for higher junction breakdown voltages. Such higher breakdown voltages, unfortunately, comes at the expense of larger device design rules, which will be described in more detail below. MOS transistors that use Extended Drain Diffusion Device MOS structures (DDDMOS) often only operate at around 12V-20V with using smaller device design rules than the LDMOS counterpart. We found a need for MOS transistor to support the 20V-30V operations. The design rules should be competitive with DDDMOS devices. Further details of limitations of conventional devices and a description of the present invention can be found throughout the present specification and more particularly below.

Figure 1:
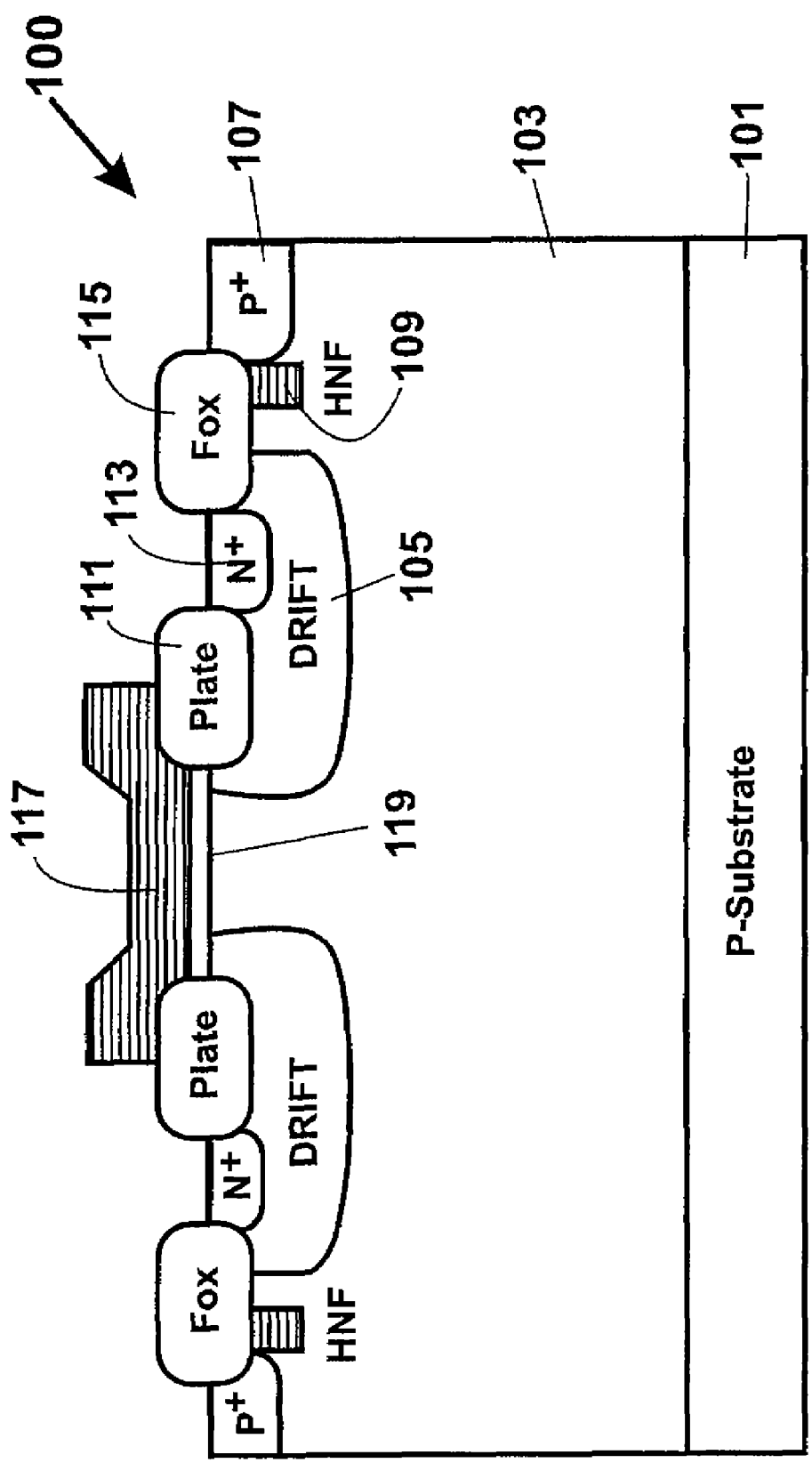
FIGS. 1 and 2 are simplified cross-sectional view diagrams of conventional high voltage semiconductor devices.

FIG. 1 is a simplified cross-sectional view diagram of a conventional LDMOS semiconductor device 100. As shown, the LDMOS device includes a P-type substrate 101. A well region 103 is formed within the P-type substrate. The device also has DRIFT 105 regions, which are implanted and diffused. High concentration N+ type regions 113 are also included. The device also has field oxide region 115, which separates the device from P+ type regions 107. A channel stop layer 109 is also included. The device has a gate electrode 117 overlying a channel region, which underlies gate dielectric layer 119.

As also shown, the gate electrode has two oxide plates 111 underlying outer edge portions of the gate structure. The oxide plates are often formed from field isolation oxide or an oxide mask layer, which is thicker than the gate dielectric layer. The thick oxide at the edges of gate electrode and gate dielectric causes higher breakdown voltages. The LDMOS device, however, has certain limitations. The thick oxide takes alot of area, which are often required for the larger breakdown voltages. Although very high operation voltages such as 40V can be achieved, the conventional LDMOS is often difficult to scale up and make smaller. Accordingly, other techniques have been proposed.

Figure 2:
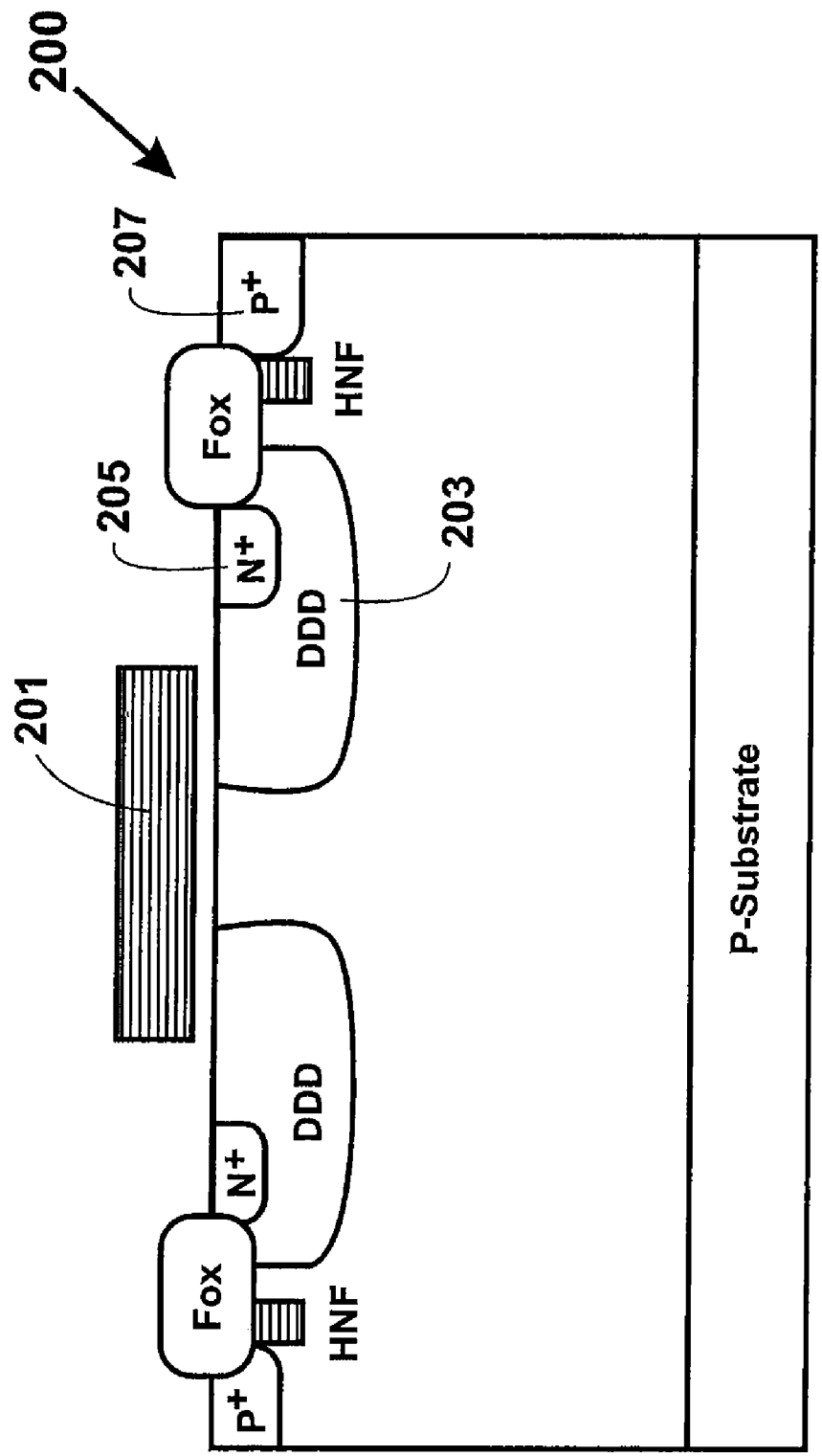

FIG. 2 is a simplified cross-sectional view diagram of a conventional Extended Drain Diffusion Device (DDD)MOS semiconductor device 200. As shown, the DDDMOS device includes a P-type substrate. A well region is formed within the P-type substrate. The device also has DDD 203 regions, which are implanted and diffused. High concentration N+ type regions 205 are also included. The device also has field oxide region, which separates the device from P+ type regions 107. A channel stop layer is also included. The device has a gate electrode 201 overlying a channel region, which underlies The conventional DDDMOS device is fabricated by forming the deep extended drain junction profile in the drain area under the gate using smaller design rules, than the LDMOS device. The deep extended drain junction results in moderately enhanced junction breakdown voltage. This MOS device can achieve 12V-20V operation voltages, which is suitable for certain applications, but cannot often achieve higher than 20V. These and other limitations of conventional device have been overcome, at least in part, using the present method and resulting high voltage semiconductor device structure. Details of the present invention can be found throughout the present specification and more particularly below.

Figure 3:
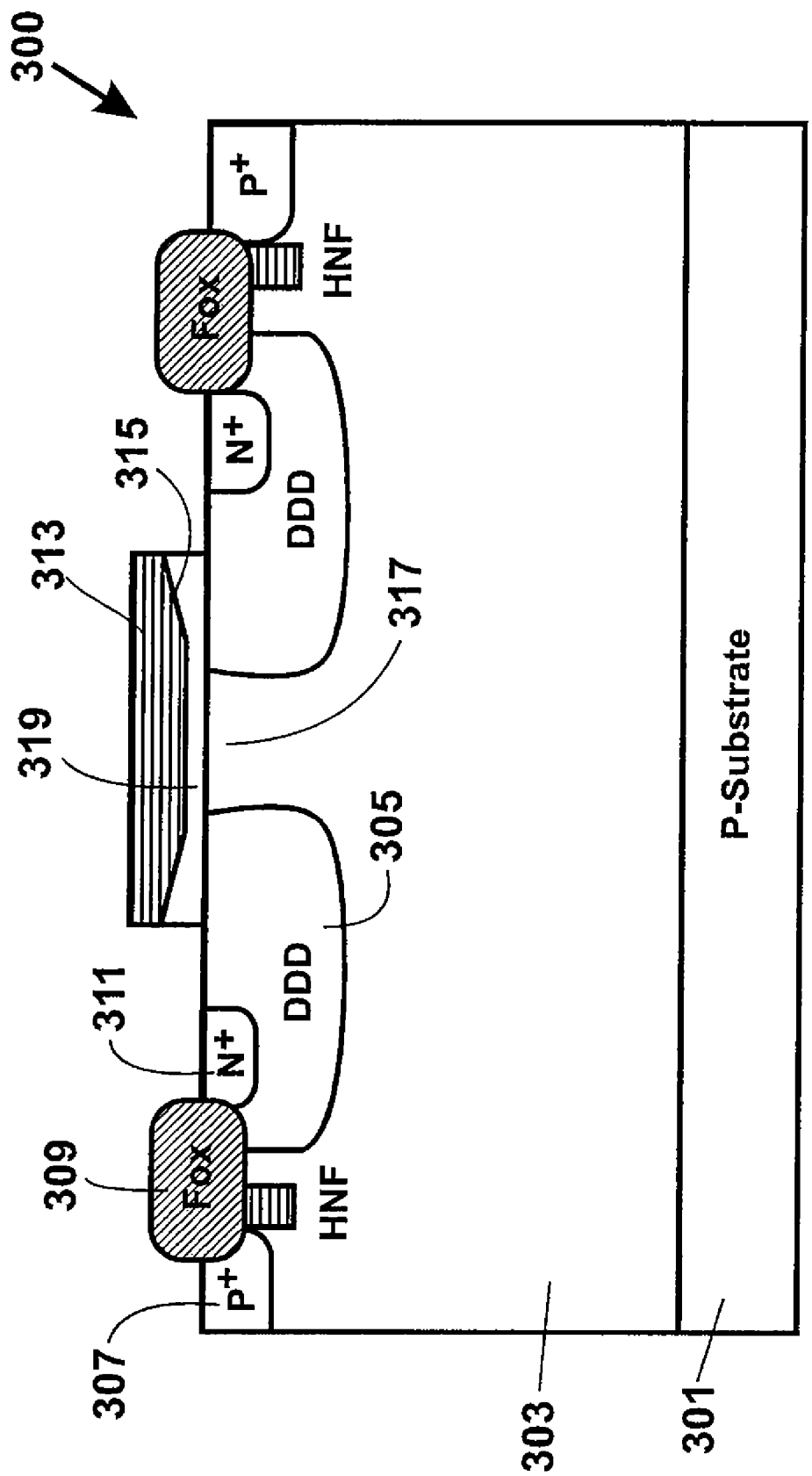
FIG. 3 is a simplified cross-sectional view diagram of a high voltage semiconductor device according to an embodiment of the present invention.

FIG. 3 is a simplified cross-sectional view diagram of a high voltage semiconductor device 300 according to an embodiment of the present invention. This diagram is merely an example, which should not unduly limit the scope of the claims herein. One of ordinary skill in the art would recognize many variations, modifications, and alternatives. As shown, the high voltage device includes a P-type substrate 301. A well region 303 is formed within the P-type substrate. The device also has DDD 305 regions, which are implanted and diffused. High concentration N+ type regions 311 are also included. The device also has field oxide region 309, which separates the device from P+ type regions 307. A channel stop layer is also included. The device has a gate electrode 313 overlying a channel region 317, which underlies gate dielectric layer 319 AND 315.

As shown, the high voltage MOS device (HMOS) is fabricated by forming a thick gate oxide portion 315 directly at the edge of the polysilicon using a controlled gate polysilicon re-oxidation process. The oxide generated from the polysilicon re-oxidation can be as thick (~1000A-2000A) as desired giving enough oxidation and polysilicon thickness to increase a breakdown voltage. Meanwhile other MOS devices (non HV devices) poly gate can be covered with a thin SiN (~50 A) hard mask to prevent the oxidation, which allows such MOS devices to operate at lower voltages. The present HMOS device can achieve very high operation voltage as LDMOS as long as edge oxide has a sufficient thickness after polysilicon oxidation. Of course, there can be other variations modifications, and alternatives.

Preferably, the high voltage device has a substrate (e.g., silicon wafer) having a surface region. The substrate has a well region within the substrate and a double diffused drain region within the well region. A gate dielectric layer is overlying the surface region. A gate polysilicon layer is overlying the gate dielectric layer. A mask layer is overlying the gate polysilicon layer. The device also has a gate electrode formed within the gate polysilicon layer. The gate electrode has a first predetermined width and a first predetermined thickness. Preferably, the gate electrode has a first side and a second side formed between the first predetermined width. The gate electrode is coupled to the double diffused drain region within the well region. Preferably, the first side has a lower corner overlying the gate dielectric layer and an upper corner underlying the mask layer and the second side has a lower corner overlying the gate dielectric layer and an upper corner underlying the mask layer. A first insulating region formed from polysilicon is formed at the lower corner on the first side of the gate electrode. The first insulating region extends from the first side toward a first preselect region within the gate electrode. A second insulating region formed from polysilicon material is at the lower corner on the second side of the gate electrode. The second insulating region extends from the second side toward a second preselected region within the gate electrode. A second predetermined width is fromed between the first preselect region and the second preselected region. The second predetermined width comprises substantially polysilicon material. Preferably, the high voltage device has a breakdown voltage of the high voltage semiconductor device is characterized by a voltage of greater than 20 volts. Details of a method of fabricating the present device can be found throughout the present specification and more particularly below.

A method for fabricating an interconnect structure according to an embodiment of the present invention may be outlined as follows:

1. Provide a substrate;
2. Form well region;
3. Form isolation regions;
4. Form active regions;
5. Form gate oxide region;
6. Form polysilicon gate region for high voltage MOS device and non-high voltage MOS device;
7. Form thin silicon nitride layer overlying non-high voltage MOS devices;
8. Perform reoxidation process;
9. Continue to increase thickness of gate oxide near edges of the gate electrodes;
10. Form silicon nitride spacers; and
11. Perform other steps, as desired.

The above sequence of steps provides a method according to an embodiment of the present invention. As shown, the method uses a combination of steps including a way of forming an interconnect structure having a low k dielectric layer. Other alternatives can also be provided where steps are added, one or more steps are removed, or one or more steps are provided in a different sequence without departing from the scope of the claims herein. Further details of the present method can be found throughout the present specification and more particularly below.

Figure 4:
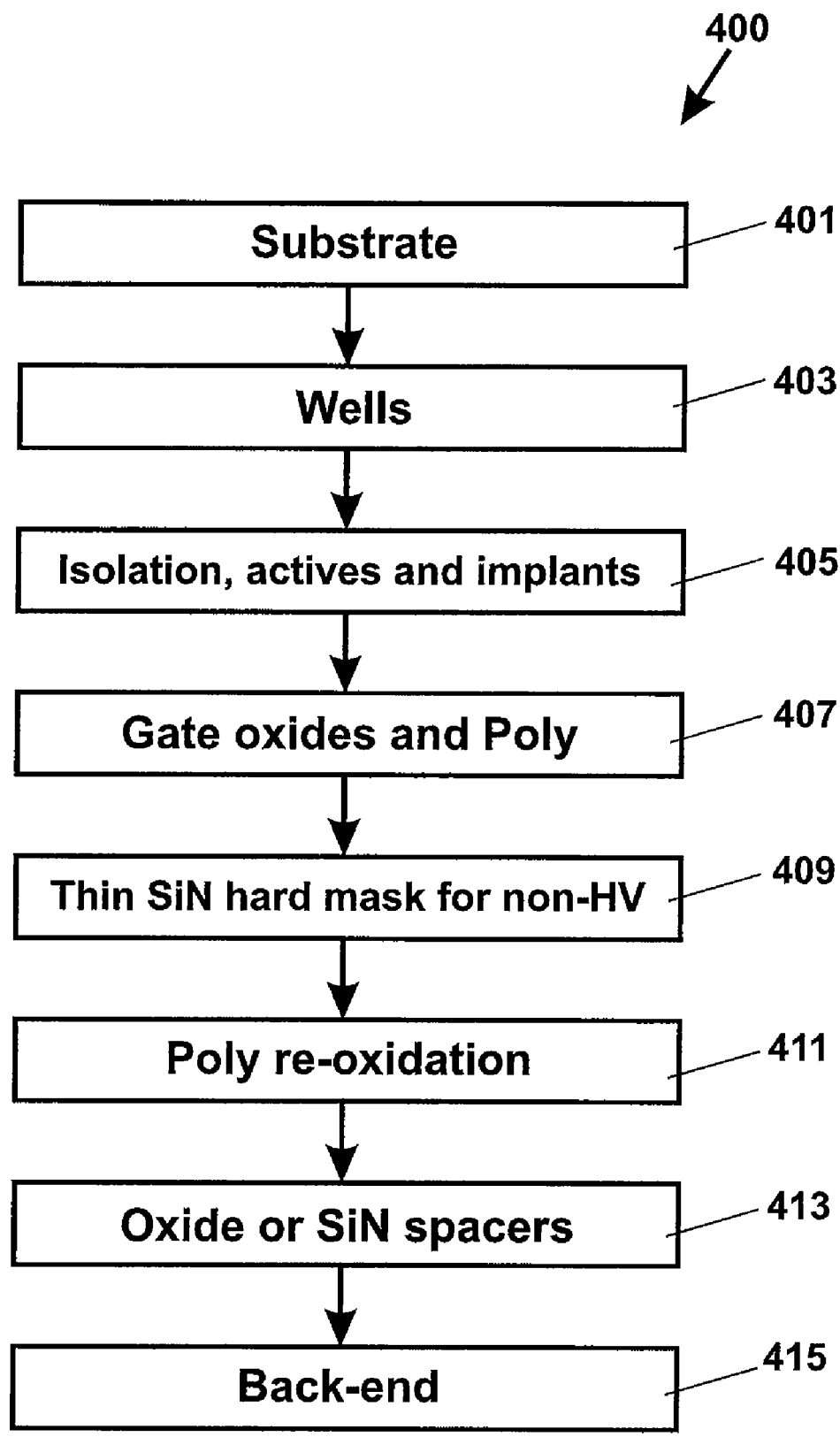
FIG. 4 is a simplified flow diagram that illustrate a method for fabricating a high voltage semiconductor device according to an embodiment of the present invention

FIG. 4 is a simplified flow diagram that illustrate a method for fabricating a high voltage semiconductor device according to an embodiment of the present invention. This diagrams are merely examples, which should not unduly limit the scope of the claims herein. One of ordinary skill in the art would recognize many variations, alternatives, and modifications. As shown, the method provides a substrate 401, e.g., silicon wafer. The substrate has an upper surface where semiconductor devices are to be formed. The method forms well regions (step 403) within portions of the semiconductor substrate. Each of the well regions has a selected depth. The method also includes forming isolation regions (step 405), such as LOCOS, shallow trench isolation, and the like. The method also forms active regions.

Next, the method forms a gate dielectric layer overlying the surface of the substrate. Preferably, the dielectric layer is a high quality oxide layer or other high quality film. Preferably, the layer is thermal oxide having a thickness of 80 Å and less. The method forms a polysilicon (step 407) gate regions for high voltage MOS devices and non-high voltage MOS devices. The polysilicon regions are gate electrodes, which have been formed using a deposition and patterning process. The polysilicon can be formed via in-situ doped polysilicon, amorphous in-situ doped polysilicon, and others. Optionally, the method forms forms a thin silicon nitride layer 409 overlying non-high voltage MOS devices. The thin nitride layer prevents further oxidation of the gate oxide and/or gate electrodes for the non-high voltage MOS devices.

The method performs a reoxidation process (step 411), which causes edges of the gate electrodes to oxidize to convert polysilicon material into silicon dioxide, which is insulating. Here, the method causes an oxidation of the gate electrode such that the lower corner on the first side and the lower corner on the second side convert from polysilicon material into silicon dioxide while the upper corner on the first side and the upper corner on the second side are substantially free from oxidation. The method continues to convert the lower corner of the first side and the lower corner of the second side to reduce the first predetermined with of the gate electrode comprising polysilicon material to a second predetermined width to increase a breakdown voltage of the high voltage semiconductor device to greater than 20 volts. The reoxidation occurs using thermal oxidation by exposing surfaces of the devices to an oxygen bearing species at high temperature such as 600 to 700 Degrees Celsius. Dry thermal oxidation is used. Preferably, the second predetermined width is less than the first predetermined width. Of course, there can be other variations, modifications, and alternatives.

The method then performs forming sidewall spacers (step 413) on edges of the gate electrodes. Preferably, the sidewall spacers are oxide spacers, but can also be nitride or any combination of oxide and nitride, depending upon the application. The method then performs other back end (step 415) processing steps, including metallization for interconnects, and passivation. These and other steps would be realized by someone of ordinary skill in the art.

Preferably, the method includes providing a substrate (e.g., silicon wafer) having a surface region. The method includes forming a well region within the substrate and forming a double diffused drain region within the well region. The method also includes forming a gate dielectric layer overlying the surface region and forming a gate polysilicon layer overlying the gate dielectric layer. A mask layer is formed overlying the gate polysilicon layer. The method includes patterning the gate polysilicon layer to form a gate electrode having a first predetermined width and a predetermined thickness. The gate electrode has a first side and a second side formed between the first predetermined width. The gate electrode is coupled to the double diffused drain region within the well region. Preferably, the first side has a lower corner overlying the gate dielectric layer and an upper corner underlying the mask layer and the second side has a lower corner overlying the gate dielectric layer and an upper corner underlying the mask layer. The method causes an oxidation of the gate electrode such that the lower corner on the first side and the lower corner on the second side convert from polysilicon material into silicon dioxide while the upper corner on the first side and the upper corner on the second side are substantially free from oxidation. The method continues to convert the lower corner of the first side and the lower corner of the second side to reduce the first predetermined with of the gate electrode comprising polysilicon material to a second predetermined width to increase a breakdown voltage of the high voltage semiconductor device to greater than 20 volts.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a high voltage semiconductor device, the method comprising:
    providing a substrate having a surface region;
    forming a well region within the substrate;
    forming a double diffused drain region within the well region;
    forming a gate dielectric layer overlying the surface region;
    forming a gate polysilicon layer overlying the gate dielectric layer;
    forming a mask layer overlying the gate polysilicon layer;
    patterning the gate polysilicon layer to form a gate electrode having a first predetermined width and a predetermined thickness, the gate electrode having a first side and a second side formed between the first predetermined width, the gate electrode being coupled to the double diffused drain region within the well region, the first side having a lower corner overlying the gate dielectric layer and an upper corner underlying the mask layer, the second side having a lower corner overlying the gate dielectric layer and an upper corner underlying the mask layer;
    causing an oxidation of the gate electrode such that the lower corner on the first side and the lower corner on the second side convert from polysilicon material into silicon dioxide while the upper corner on the first side and the upper corner on the second side are substantially free from oxidation; and
    continuing to convert the lower corner of the first side and the lower corner of the second side to reduce the first predetermined with of the gate electrode comprising polysilicon material to a second predetermined width comprising polysilicon material to increase a breakdown voltage of the high voltage semiconductor device to greater than 20 volts.

2. The method of claim 1 wherein the gate electrode comprises a doped polysilicon material.

3. The method of claim 1 wherein the second predetermined width is less than the first predetermined width.

4. The method of claim 1 wherein the upper corner on the first side and the upper corner on the second side are substantially protected by the overlying mask layer from oxygen bearing species.

5. The method of claim 1 wherein the oxidation is provided by an oxygen bearing species.

6. The method of claim 1 wherein the oxidation is maintained at a temperature ranging from about 600 Degrees Celsius to about 750 Degrees Celsius.

7. The method of claim 1 wherein the mask layer is a silicon nitride layer.

8. The method of claim 1 wherein the mask layer is a tungsten silicide layer.

9. The method of claim 1 wherein the lower corner of the first side and the lower corner of the second side are substantially oxide and insulating in characteristic.

* * * * *